(12) United States Patent
Kim et al.

(10) Patent No.: US 11,417,866 B2
(45) Date of Patent: Aug. 16, 2022

(54) ANISOTROPIC CONDUCTIVE FILM AND DISPLAY DEVICE INCLUDING THE SAME

(71) Applicant: LG Display Co., Ltd., Seoul (KR)

(72) Inventors: Seulki Kim, Seosan-si (KR); Sungjoon Min, Gimpo-si (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 15/816,008

(22) Filed: Nov. 17, 2017

(65) Prior Publication Data

US 2018/0151849 A1 May 31, 2018

(30) Foreign Application Priority Data

Nov. 30, 2016 (KR) .................. 10-2016-0161541

(51) Int. Cl.
| | | |
|---|---|---|
| H01L 51/56 | (2006.01) | |
| G02F 1/00 | (2006.01) | |
| H01L 23/48 | (2006.01) | |
| H01L 23/498 | (2006.01) | |
| H01L 27/32 | (2006.01) | |
| H05K 1/03 | (2006.01) | |

(52) U.S. Cl.
CPC ............... *H01L 51/56* (2013.01); *G02F 1/00* (2013.01); *H01L 23/481* (2013.01); *H01L 23/49816* (2013.01); *H01L 27/3244* (2013.01); *H05K 1/0393* (2013.01); *H01L 27/3276* (2013.01)

(58) Field of Classification Search
None
See application file for complete search history.

(56) References Cited

U.S. PATENT DOCUMENTS

| | | | | |
|---|---|---|---|---|
| 4,963,002 A | * | 10/1990 | Tagusa | H01L 23/5328 349/149 |
| 6,972,490 B2 | * | 12/2005 | Chang | H01L 24/05 257/E21.511 |
| 7,538,020 B2 | * | 5/2009 | Wang | H01L 24/11 438/612 |
| 2002/0140643 A1 | * | 10/2002 | Sato | H01L 51/5237 345/76 |
| 2003/0203668 A1 | | 10/2003 | Cobbley et al. | |

(Continued)

FOREIGN PATENT DOCUMENTS

| | | |
|---|---|---|
| JP | 2003-286456 A | 10/2003 |
| JP | 2003-286457 A | 10/2003 |
| KR | 10-2010-0010694 A | 2/2010 |

OTHER PUBLICATIONS

Extended European Search Report dated Jun. 16, 2020, from the European Patent Office in counterpart EP application No. 17 204 293.9.

(Continued)

*Primary Examiner* — Nishath Yasmeen
(74) *Attorney, Agent, or Firm* — Morgan, Lewis & Bockius LLP

(57) ABSTRACT

An anisotropic conductive film, and a display device including the same includes a first non-conductive layer; a pattern layer on the first non-conductive layer and having a plurality of holes; a plurality of conductive balls in the plurality of holes of the pattern layer; and a second non-conductive layer on the pattern layer and the plurality of conductive balls.

20 Claims, 13 Drawing Sheets

(56) References Cited

U.S. PATENT DOCUMENTS

| | | | |
|---|---|---|---|
| 2009/0096973 A1* | 4/2009 | Ueda | G02F 1/13452 |
| | | | 349/138 |
| 2009/0153765 A1* | 6/2009 | Yamashita | H05K 3/323 |
| | | | 361/679.21 |
| 2009/0206734 A1 | 8/2009 | Kim et al. | |
| 2010/0065862 A1* | 3/2010 | Ray | B82Y 30/00 |
| | | | 257/E31.127 |
| 2011/0079501 A1* | 4/2011 | Arai | G06F 3/0412 |
| | | | 361/679.01 |
| 2011/0102385 A1* | 5/2011 | Jung | G02F 1/13452 |
| | | | 427/547 |
| 2012/0089180 A1* | 4/2012 | Fathi | H01L 25/0657 |
| | | | 257/E23.116 |
| 2013/0026476 A1* | 1/2013 | Park | H01L 27/3276 |
| | | | 257/40 |
| 2014/0355226 A1* | 12/2014 | Kim | H05K 3/361 |
| | | | 361/768 |
| 2014/0355266 A1* | 12/2014 | Hsue | G09F 9/3026 |
| | | | 362/249.04 |
| 2015/0208511 A1 | 7/2015 | Ishimatsu | |
| 2017/0062379 A1* | 3/2017 | Zhang | H01L 24/16 |
| 2018/0090066 A1* | 3/2018 | Furuie | H01L 27/3211 |

OTHER PUBLICATIONS

Extended European Search Report dated Apr. 20, 2018 from the European Patent Office in counterpart EP application No. 17204293.9.

* cited by examiner

ANISOTROPIC CONDUCTIVE FILM AND DISPLAY DEVICE INCLUDING THE SAME

This application claims the priority benefit of Korean Patent Application No. 10-2016-0161541 filed on Nov. 30, 2016, which is incorporated herein by reference for all purposes as if fully set forth herein.

BACKGROUND

Technical Field

The present disclosure relates to an anisotropic conductive film and a display device including the same.

Discussion of the Related Art

With the development of an information society, the demand for display devices to display images has increased. In the field of the display devices, a large-sized cathode ray tube (CRT) has been rapidly replaced by a flat panel display (FPD) due to advantages of thin profile, low weight, and large size screen. Examples of flat panel displays include a liquid crystal display (LCD), a plasma display panel (PDP), an organic light emitting diode (OLED) display, and an electrophoresis display (EPD).

An OLED display includes self-emitting elements capable of emitting light by themselves and has advantages of fast response time, high emission efficiency, high luminance, and wide viewing angle. In particular, the OLED display can be manufactured on a flexible plastic substrate. In addition, the OLED display has advantages of a lower driving voltage, lower power consumption, and better color tone as compared to a plasma display panel or an inorganic electroluminescent display.

In the OLED display manufactured on the flexible plastic substrate, polyimide is coated on a glass substrate, elements such as a thin film transistor and an organic light emitting diode are manufactured, and a chip-on film (COF) is attached to a pad portion. A process for separating the glass substrate is performed to manufacture the OLED display including a flexible polyimide substrate.

A process for attaching the chip-on film to the pad portion of the OLED display is performed by forming an anisotropic conductive film on the chip-on film and then attaching the anisotropic conductive film to the pad portion through a tape-automated bonding (TAB) process. The TAB process pressurizes the pad portion, the anisotropic conductive film, and the chip-on film and electrically connects the pad portion to the chip-on film by conductive balls of the anisotropic conductive film. However, there is a problem if the conductive balls of the anisotropic conductive film do not contact lines of the pad portion and lines of the chip-on film.

SUMMARY

Accordingly, embodiments of the present disclosure are directed to an anisotropic conductive film and a display device including the same that substantially obviate one or more of the problems due to limitations and disadvantages of the related art.

An aspect of the present disclosure is to provide an anisotropic conductive film whose conductive balls can smoothly contact lines of a pad portion.

Another aspect of the present disclosure is to provide a display device capable of preventing a defective drive by smoothly contacting lines of a pad portion and conductive balls of an anisotropic conductive film.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, an anisotropic conductive film comprises a first non-conductive layer; a pattern layer on the first non-conductive layer and including a plurality of holes; a plurality of conductive balls in the plurality of holes of the pattern layer; and a second non-conductive layer on the pattern layer and the plurality of conductive balls.

In another aspect, a display device comprises a flexible substrate; a display unit on the flexible substrate and including organic light emitting diodes; a pad portion at an edge region of the flexible substrate, the pad portion including a plurality of pad electrodes; a chip-on film on the pad portion; and an anisotropic conductive film disposed between the pad portion and the chip-on film and configured to attach the pad portion to the chip-on film, wherein the anisotropic conductive film includes: a first non-conductive layer; a pattern layer on the first non-conductive layer and including a plurality of holes; a plurality of conductive balls in the plurality of holes of the pattern layer; and a second non-conductive layer on the pattern layer and the plurality of conductive balls.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles. In the drawings.

DETAILED DESCRIPTION

Reference will now be made in detail to embodiments of the disclosure, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the disclosure. Names of the respective elements used in the following explanations are selected only for convenience of writing the specification and may be thus different from those used in actual products.

A display device according to an example embodiment is a flexible display device, in which a display element is formed on a flexible substrate. Examples of the flexible display device include an organic light emitting diode (OLED) display, a liquid crystal display (LCD), and an electrophoresis display. Embodiments are described using the OLED display by way of example. An OLED display includes an organic layer formed of an organic material between a first electrode serving as an anode and a second electrode serving as a cathode. The OLED display is a self-emission display device configured to form hole-electron pairs, e.g., excitons by combining holes received from the first electrode and electrons received from the second electrode inside the organic layers and emits light by energy generated when the excitons return to a ground level.

Example embodiments are described below with reference to FIGS. 1 to 17.

Figure 1:
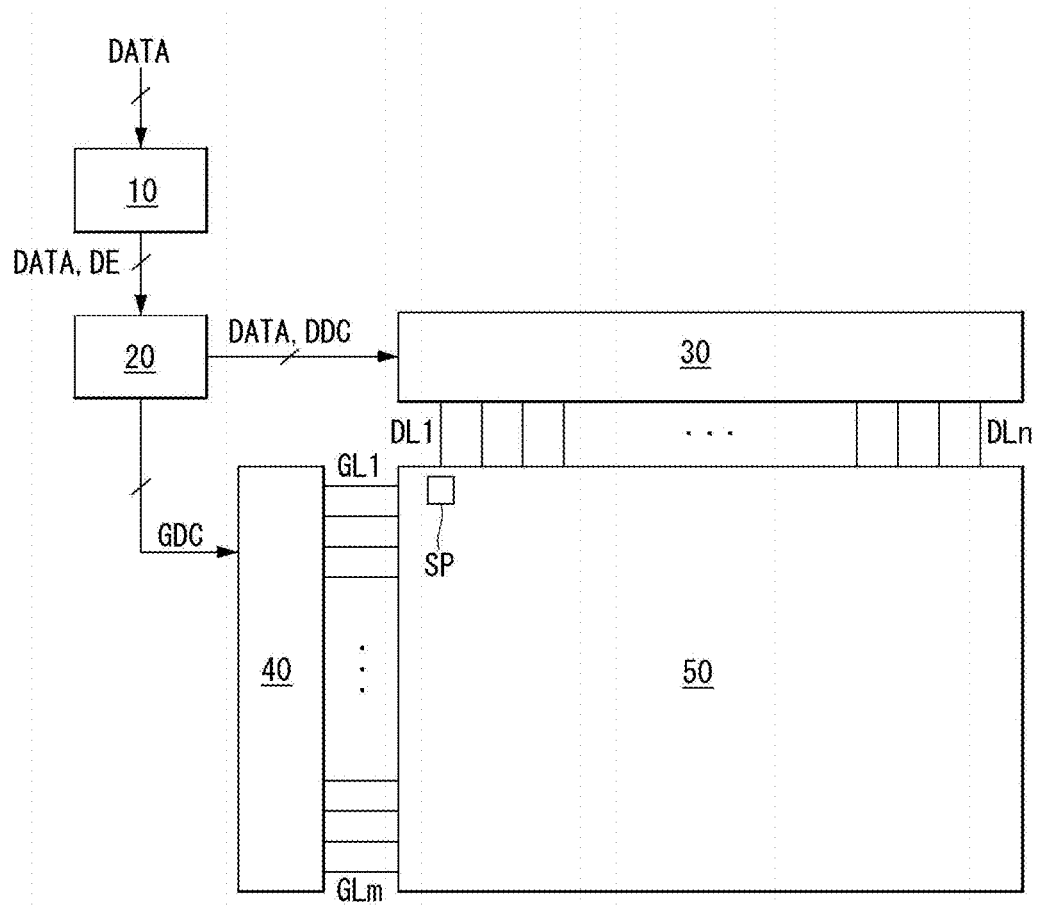
FIG. 1 is a schematic block diagram of an organic light emitting diode (OLED) display according to an example embodiment.
Figure 2:
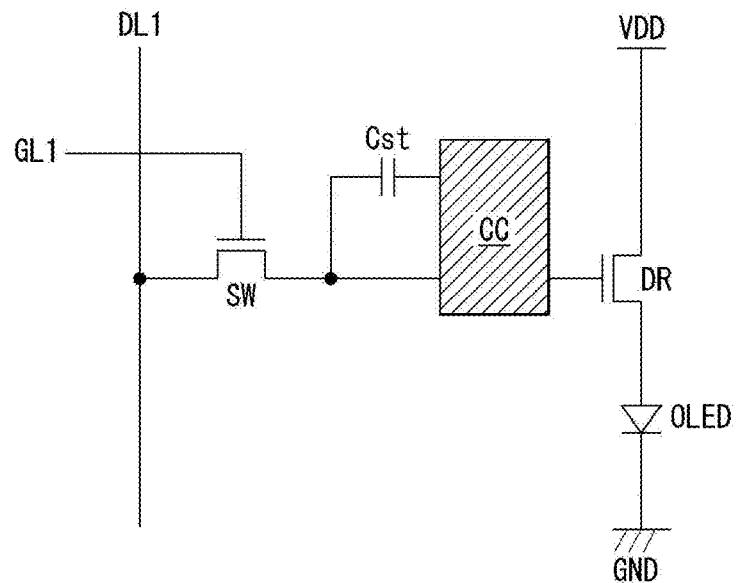
FIG. 2 illustrates a first example of a circuit configuration of a subpixel.
Figure 3:
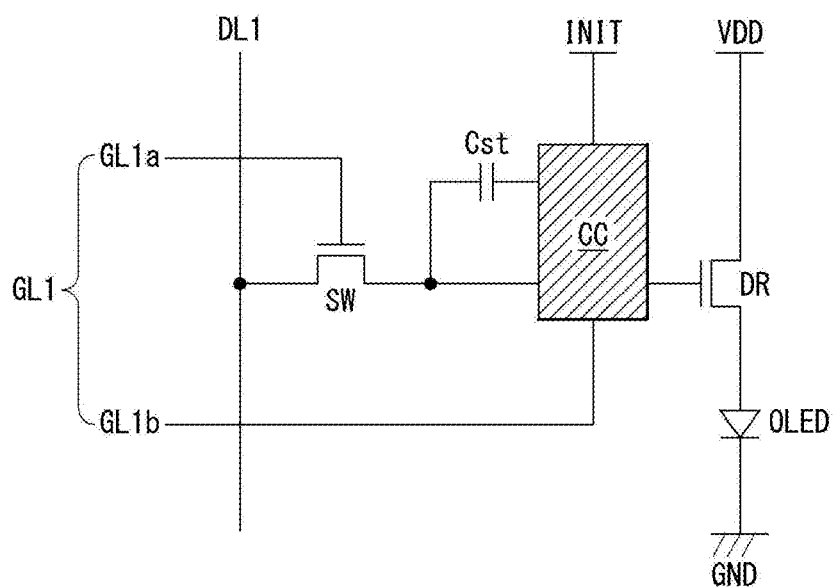
FIG. 3 illustrates a second example of a circuit configuration of a subpixel.

FIG. 1 is a schematic block diagram of an OLED display according to an example embodiment. FIG. 2 illustrates a first example of a circuit configuration of a subpixel. FIG. 3 illustrates a second example of a circuit configuration of a subpixel.

With reference to FIG. 1, an OLED display according to an example embodiment includes an image processing unit 10, a timing controller 20, a data driver 30, a gate driver 40, and a display panel 50.

The image processing unit 10 outputs a data signal DATA and a data enable signal DE supplied from the outside. The image processing unit 10 may output one or more of a vertical sync signal, a horizontal sync signal, and a clock signal in addition to the data enable signal DE. For convenience of explanation, these signals are not shown. The image processing unit 10 is formed on a system circuit board as an integrated circuit (IC).

The timing controller 20 receives the data signal DATA and driving signals including the data enable signal DE or the vertical sync signal, the horizontal sync signal, the clock signal, etc. from the image processing unit 10. The timing controller 20 outputs a gate timing control signal GDC for controlling operation timing of the gate driver 40 and a data timing control signal DDC for controlling operation timing of the data driver 30 based on the driving signals. The timing controller 20 may be formed on a control circuit board as an IC.

The data driver 30 samples and latches the data signal DATA received from the timing controller 20 in response to the data timing control signal DDC supplied from the timing controller 20 and converts the sampled and latched data signal DATA using gamma reference voltages. The data driver 30 outputs the converted data signal DATA to data lines DL1 to DLn. The data driver 30 is attached to a substrate as an IC.

The gate driver 40 outputs a gate signal while shifting a level of a gate voltage in response to the gate timing control signal GDC supplied from the timing controller 20. The gate driver 40 outputs the gate signal to gate lines GL1 to GLm. The gate driver 40 is formed on a gate circuit board as an IC or is formed on the display panel 50 in a gate-in-panel (GIP) manner.

The display panel 50 displays an image in response to the data signal DATA and the gate signal respectively received from the data driver 30 and the gate driver 40. The display panel 50 includes subpixels SP for displaying an image.

As shown in FIG. 2, each subpixel may include a switching transistor SW, a driving transistor DR, a compensation circuit CC, and an organic light emitting diode (OLED). The OLED operates to emit light based on a driving current generated by the driving transistor DR.

The switching transistor SW performs a switching operation so that a data signal supplied through a first data line DL1 is stored in a capacitor Cst as a data voltage in response to a gate signal supplied through a gate line GL1. The driving transistor DR enables a driving current to flow between a high potential power line VDD and a low potential power line GND based on the data voltage stored in the capacitor Cst. The compensation circuit CC is a circuit for compensating for a threshold voltage of the driving transistor DR. A capacitor connected to the switching transistor SW or the driving transistor DR may be mounted inside the compensation circuit CC. The compensation circuit CC includes one or more thin film transistors (TFTs) and a capacitor. Configuration of the compensation circuit CC may be variously changed depending on a compensation method. A brief description of the compensation circuit CC will now be made.

As shown in FIG. 3, a subpixel including the compensation circuit CC may further include a signal line and a power line for driving a compensation TFT and supplying a predetermined signal or electric power. The gate line GL1 may include a 1-1 gate line GL1a supplying the gate signal to the switching transistor SW and a 1-2 gate line GL1b for driving the compensation TFT included in the subpixel. The added power line may be an initialization power line INIT for initializing a predetermined node of the subpixel to a predetermined voltage. However, this is merely an example, and embodiments are not limited thereto.

FIGS. 2 and 3 illustrate an example in which one subpixel includes the compensation circuit CC. However, the compensation circuit CC may be omitted when an object (for example, the data driver 30) to be compensated is positioned outside the subpixel. The subpixel has a configuration of 2T(Transistor)1C(Capacitor) in which the switching transistor SW, the driving transistor DR, the capacitor, and the OLED are provided. However, when the compensation circuit CC is added to the subpixel, the subpixel may have various configurations such as 3T1C, 4T2C, 5T2C, 6T2C, 7T2C, and the like. Also, FIGS. 2 and 3 illustrate that the compensation circuit CC is positioned between the switching transistor SW and the driving transistor DR by way of an example. However, the compensation circuit CC may be further positioned between the driving transistor DR and the OLED. The position and the structure of the compensation circuit CC are not limited to the ones illustrated in FIGS. 2 and 3.

Figure 4:
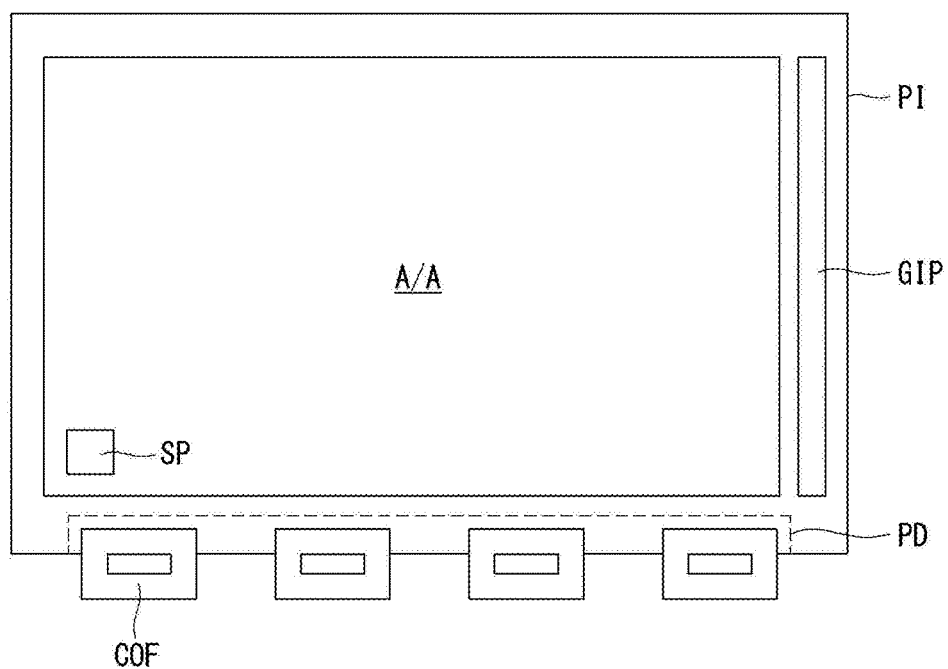
FIG. 4 is a plan view of an OLED display according to an example embodiment.
Figure 5:
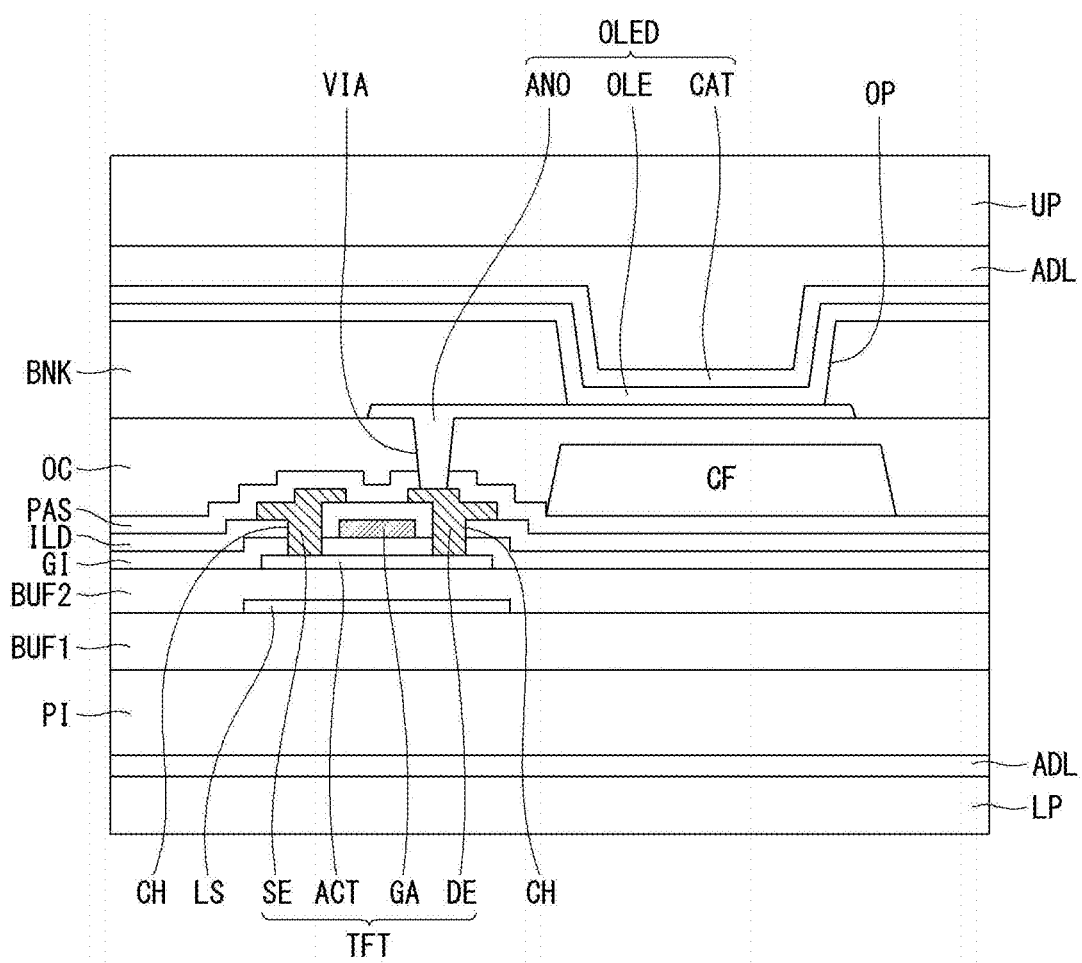
FIG. 5 is a cross-sectional view illustrating a subpixel of an OLED display according to an example embodiment.
Figure 6:
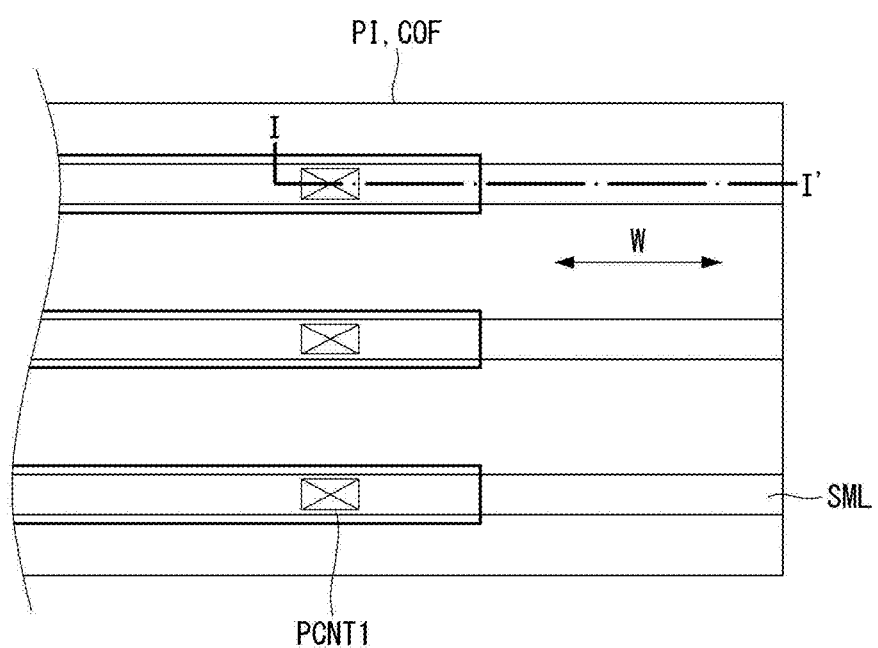
FIG. 6 is an enlarged plan view of a pad portion shown in FIG. 4.
Figure 7:
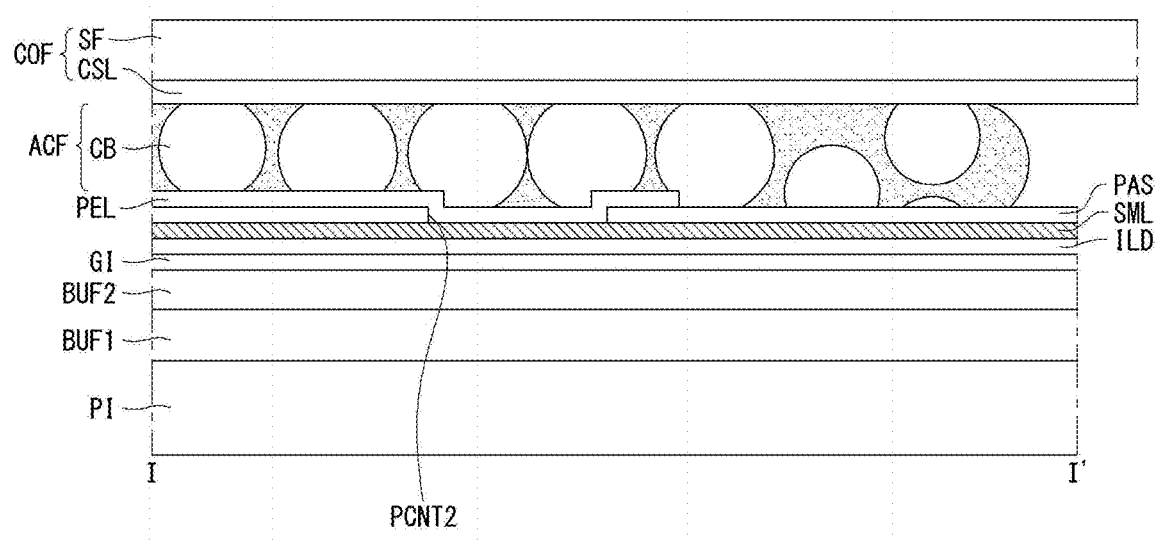
FIG. 7 is a cross-sectional view taken along line I-I' of FIG. 6.

FIG. 4 is a plan view of an OLED display according to an example embodiment. FIG. 5 is a cross-sectional view illustrating a subpixel of an OLED display according to an example embodiment. FIG. 6 is an enlarged plan view of a pad portion shown in FIG. 4. FIG. 7 is a cross-sectional view taken along line I-I' of FIG. 6.

With reference to FIG. 4, an OLED display includes a flexible substrate PI, a display unit A/A, a GIP driver GIP disposed on a right side of the flexible substrate PI outside the display unit A/A, and a pad portion PD disposed on a lower side of the flexible substrate PI. The display unit A/A may include a plurality of subpixels SP. For example, R (red), G (green), and B (blue) subpixels or R, B, and W (white) subpixels of the display unit A/A may emit light to represent a full color. The GIP driver GIP is disposed on one side, for example, the right side of the display unit A/A and applies a gate driving signal to the display unit A/A. Chip-on films COF are attached to the pad portion PD disposed on one side, for example, the lower side of the display unit A/A. A data signal and electric power are applied to a plurality of signal lines (not shown) connected to the display unit A/A through the chip-on films COF.

A cross-sectional structure of a subpixel SP of the OLED display according to the embodiment is described below with reference to FIG. 5.

As shown in FIG. 5, in the OLED display according to the embodiment, a first buffer layer BUF1 is positioned on the flexible substrate PI. The flexible substrate PI may be, for example, a polyimide substrate. Thus, the flexible substrate PI according to the embodiment may have a flexible characteristic. The first buffer layer BUF1 protects a thin film transistor formed in a subsequent process from impurities, for example, alkali ions discharged from the flexible substrate PI. The first buffer layer BUF1 may be a silicon oxide (SiOx) layer, a silicon nitride (SiNx) layer, or a multilayer thereof.

A shield layer LS is positioned on the first buffer layer BUF1. The shield layer LS prevents a reduction in a panel driving current which may be generated using a polyimide substrate. A second buffer BUF2 is positioned on the shield layer LS. The second buffer BUF2 protects a thin film transistor formed in a subsequent process from impurities, for example, alkali ions discharged from the shield layer LS. The second buffer layer BUF2 may be formed of, for example, a silicon oxide (SiOx) layer, a silicon nitride (SiNx) layer, or a multilayer thereof.

A semiconductor layer ACT is positioned on the second buffer layer BUF2 and may be formed of a silicon semiconductor or an oxide semiconductor. The silicon semiconductor may include amorphous silicon or crystallized polycrystalline silicon. The polycrystalline silicon has high mobility (for example, more than 100 cm$^2$/Vs), low power consumption, and excellent reliability. Thus, the polycrystalline silicon can be applied to a gate driver and/or a multiplexer (MUX) for use in a driving element or applied for a driving TFT of each pixel of the OLED display. Because the oxide semiconductor has a low OFF-current, the oxide semiconductor is suitable for a switching TFT which has a short ON-time and a long OFF-time. Further, because the oxide semiconductor increases a voltage hold time of the pixel due to the low OFF-current, the oxide semiconductor is suitable for a display device requiring a low-speed drive and/or low power consumption. In addition, the semiconductor layer ACT includes a drain region and a source region each including p-type or n-type impurities, and also includes a channel region between the drain region and the source region.

A gate insulating layer GI is positioned on the semiconductor layer ACT and may be formed of a silicon oxide (SiOx) layer, a silicon nitride (SiNx) layer, or a multilayer thereof. A gate electrode GA is positioned on the gate insulating layer GI at a location corresponding to a predetermined region (e.g., the channel region when impurities are injected) of the semiconductor layer ACT. The gate electrode GA may be formed of one of molybdenum (Mo), aluminum (Al), chrome (Cr), gold (Au), titanium (Ti), nickel (Ni), neodymium (Nd), copper (Cu), or a combination thereof. Further, the gate electrode GA may be a multilayer formed of one of molybdenum (Mo), aluminum (Al), chrome (Cr), gold (Au), titanium (Ti), nickel (Ni), neodymium (Nd), copper (Cu), or a combination thereof. For example, the gate electrode GA may be formed as a double layer of Mo/Al—Nd or Mo/Al.

An interlayer dielectric layer ILD is positioned on the gate electrode GA and insulates the gate electrode GA. The interlayer dielectric layer ILD may be formed of a silicon oxide (SiOx) layer, a silicon nitride (SiNx) layer, or a multilayer thereof. Contact holes CH exposing a portion of the semiconductor layer ACT are formed at a portion where each of the interlayer dielectric layer ILD and the gate insulating layer GI is formed.

A drain electrode DE and a source electrode SE are positioned on the interlayer dielectric layer ILD. The drain electrode DE is connected to the semiconductor layer ACT through the contact hole CH exposing the drain region of the semiconductor layer ACT, and the source electrode SE is connected to the semiconductor layer ACT through the contact hole CH exposing the source region of the semiconductor layer ACT. Each of the source electrode SE and the drain electrode DE may be formed as a single layer or as a multilayer. When each of the source electrode SE and the drain electrode DE is formed as the single layer, each of the source electrode SE and the drain electrode DE may be formed of one of molybdenum (Mo), aluminum (Al), chrome (Cr), gold (Au), titanium (Ti), nickel (Ni), neodymium (Nd), copper (Cu), or a combination thereof. When each of the source electrode SE and the drain electrode DE is formed as the multilayer, each of the source electrode SE and the drain electrode DE may be formed as a double layer of Mo/Al—Nd or as a triple layer of Ti/Al/Ti, Mo/Al/Mo or Mo/Al—Nd/Mo. Thus, a thin film transistor TFT including the semiconductor layer ACT, the gate electrode GA, the source electrode SE, and the drain electrode DE is formed.

Further, a passivation layer PAS is positioned on the flexible substrate PI including the thin film transistor TFT. The passivation layer PAS is an insulating layer protecting the component underlying the passivation layer PAS and may be formed of a silicon oxide (SiOx) layer, a silicon nitride (SiNx) layer, or a multilayer thereof. A color filter CF is positioned on the passivation layer PAS. The color filter CF converts white light emitted by an organic light emitting diode OLED into red, green, or blue light. An overcoat layer OC is positioned on the color filter CF. The overcoat layer OC may be a planarization layer for reducing a height difference (or step coverage) of an underlying structure and may be formed of an organic material, such as polyimide, benzocyclobutene-based resin, and acrylate. For example, the overcoat layer OC may be formed through a spin-on glass (SOG) method for coating the organic material in a liquid state and then curing the organic material.

A via hole VIA exposing the drain electrode DE of the thin film transistor TFT is positioned in a portion of the overcoat layer OC. The organic light emitting diode OLED is positioned on the overcoat layer OC. More specifically, a first electrode ANO is positioned on the overcoat layer OC. The first electrode ANO serves as a pixel electrode and is connected to the drain electrode DE of the thin film transistor TFT through the via hole VIA. The first electrode ANO is an anode and may be formed of a transparent conductive material such as indium tin oxide (ITO), indium zinc oxide (IZO), and zinc oxide (ZnO). When the first electrode ANO is a reflective electrode, the first electrode ANO may further include a reflective layer. The reflective layer may be formed of aluminum (Al), copper (Cu), silver (Ag), nickel (Ni), palladium (Pd), or a combination thereof. For example, the reflective layer may be formed of an Ag/Pd/Cu (APC) alloy.

In addition, a bank layer BNK defining pixels is positioned on the flexible substrate PI including the first electrode ANO. The bank layer BNK may be formed of an organic material such as polyimide, benzocyclobutene-based resin, and acrylate. The bank layer BNK includes a pixel definition portion OP exposing the first electrode ANO. An organic layer OLE contacting the first electrode ANO is positioned at a front surface of the flexible substrate PI. The organic layer OLE is a layer, in which electrons and holes combine and emit light. A hole injection layer and/or a hole transport layer may be positioned between the organic layer OLE and the first electrode ANO, and an electron injection layer and/or an electron transport layer may be positioned on the organic layer OLE.

A second electrode CAT is positioned on the organic layer OLE and may be positioned on the entire surface of the display area A/A, as shown in FIG. 4. In addition, the second electrode CAT is a cathode electrode and may be formed of magnesium (Mg), calcium (Ca), aluminum (Al), silver (Ag), or a combination thereof each having a low work function. When the second electrode CAT is a transmissive electrode, the second electrode CAT may be thin enough to transmit light. Further, when the second electrode CAT is a reflective electrode, the second electrode CAT may be thick enough to reflect light.

An upper protective member UP is attached to an upper surface of the flexible substrate PI, on which the thin film transistor TFT and the organic light emitting diode OLED are formed, through an adhesive layer ADL. The upper protective member UP may be a transparent flexible substrate or a metal thin film. Further, a lower protective member LP is attached to a lower surface of the flexible substrate PI through an adhesive layer ADL. Because the lower protective member LP transmits light, the lower protective member LP may be formed of a transparent plastic film.

The pad portion is described below with reference to FIGS. 6 and 7, as an example. The first buffer layer BUF1 is positioned on the flexible substrate PI, and the second buffer BUF2 is positioned on the first buffer layer BUF1. The gate insulating layer GI is positioned on the second buffer BUF2, and the interlayer dielectric layer ILD is positioned on the gate insulating layer GI. A source metal layer SML is positioned on the interlayer dielectric layer ILD. The source metal layer SML is a source signal line extended from the display unit A/A. The passivation layer PAS is positioned on the source metal layer SML. The passivation layer PAS has a first contact hole PCNT1 exposing a portion of the source metal layer SML. A pad electrode PEL is positioned on the passivation layer PAS. The pad electrode PEL may be formed of the same material as the first electrode of the display unit and is connected to the source metal layer SML through the first contact hole PCNT1 of the passivation layer PAS. Thus, the pad portion including the first buffer layer BUF1, the second buffer BUF2, the gate insulating layer GI, the interlayer dielectric layer ILD, the source metal layer SML, the passivation layer PAS, and the pad electrode PEL is configured.

The chip-on film COF is attached to the flexible substrate PI, on which the pad portion is disposed, through an anisotropic conductive film ACF. The chip-on film COF may be a flexible printed circuit board mounted with a driver IC. The chip-on film COF may include a flexible film SF and flexible printed circuit lines CSL. The anisotropic conductive film ACF includes a plurality of conductive balls CB and electrically connects the flexible substrate PI to the chip-on film COF while attaching them. Namely, the conductive ball CB of the anisotropic conductive film ACF contacts the pad electrode PEL and the flexible printed circuit line CSL and electrically connects them.

The conductive balls CB are randomly disposed inside the anisotropic conductive film ACF. For example, a large number of conductive balls CB may be distributed in a portion of the anisotropic conductive film ACF, and a small number of conductive balls CB may be distributed in a portion of the anisotropic conductive film ACF. In the portion in which a large number of conductive balls CB are distributed, the conductive balls CB may be gathered. Hence, the pad electrodes PEL may not be respectively connected to the flexible printed circuit lines CSL. For example, one pad electrode PEL may be connected to the plurality of flexible printed circuit lines CSL, the plurality of pad electrodes PEL may be connected to one flexible printed circuit line CSL, or the plurality of pad electrodes PEL may be connected to the plurality of flexible printed circuit lines CSL. On the contrary, in the portion in which a small number of conductive balls CB are distributed, there may be an area in which the conductive ball CB is not disposed, and thus the pad electrode PEL and the flexible printed circuit line CSL may not be connected to each other. As a result, a defective drive of the display device may occur due to the non-uniform distribution of the conductive balls CB inside the anisotropic conductive film ACF.

On the other hand, the embodiment can provide the anisotropic conductive film ACF smoothly connecting the pad electrodes PEL to the flexible printed circuit lines CSL by adjusting the distribution of the conductive balls CB inside the anisotropic conductive film ACF.

Figure 8:
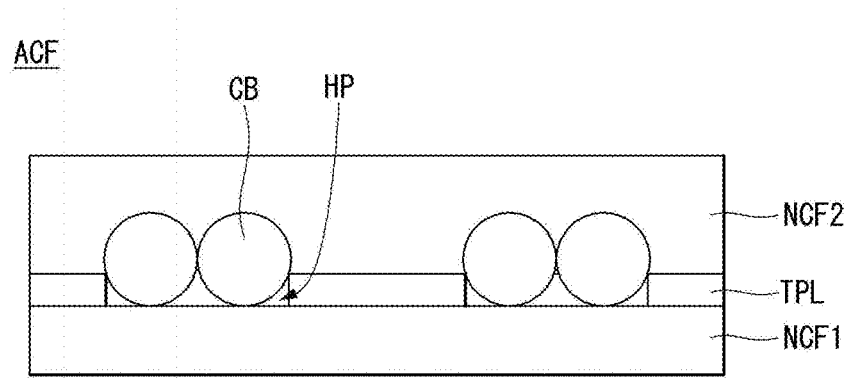
FIG. 8 is a cross-sectional view of an anisotropic conductive film according to an example embodiment.
Figure 9:
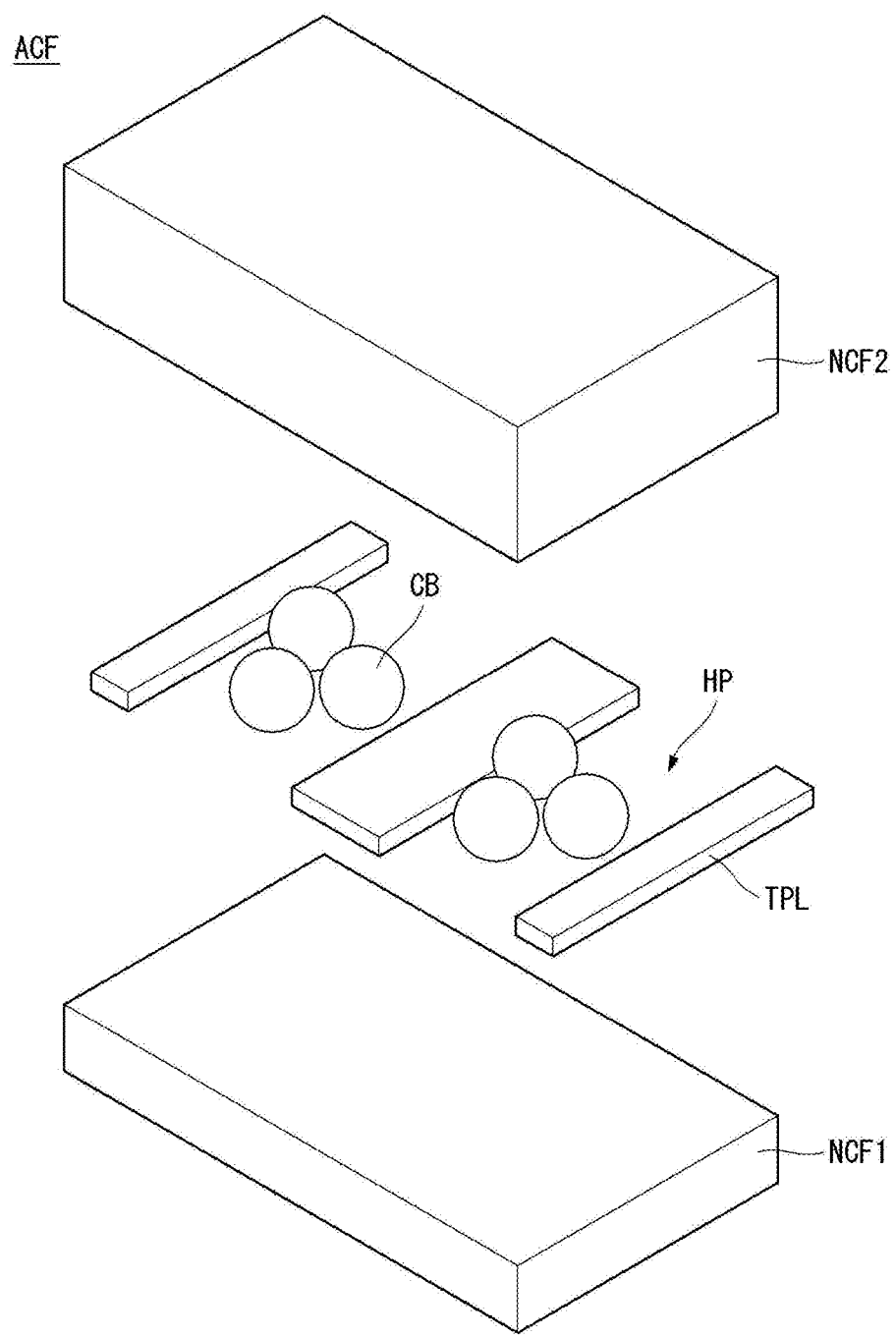
FIG. 9 is a perspective view of an anisotropic conductive film according to an example embodiment.
Figure 10:
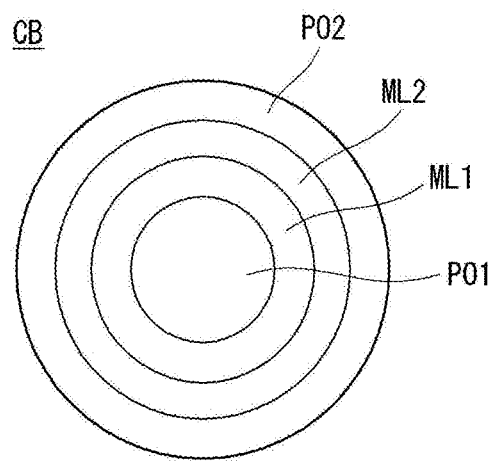
FIG. 10 is a cross-sectional view of a conductive ball of an anisotropic conductive film.
Figure 11:
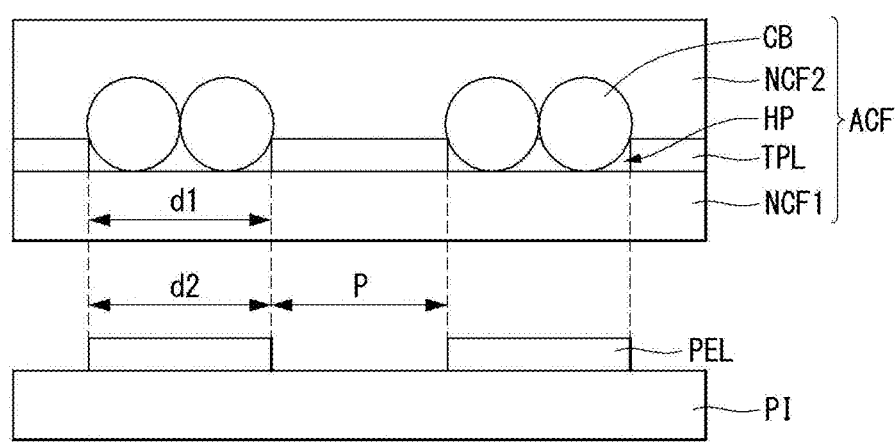
FIGS. 11 and 12 are cross-sectional views illustrating a substrate and an anisotropic conductive film according to an example embodiment.
Figure 12:
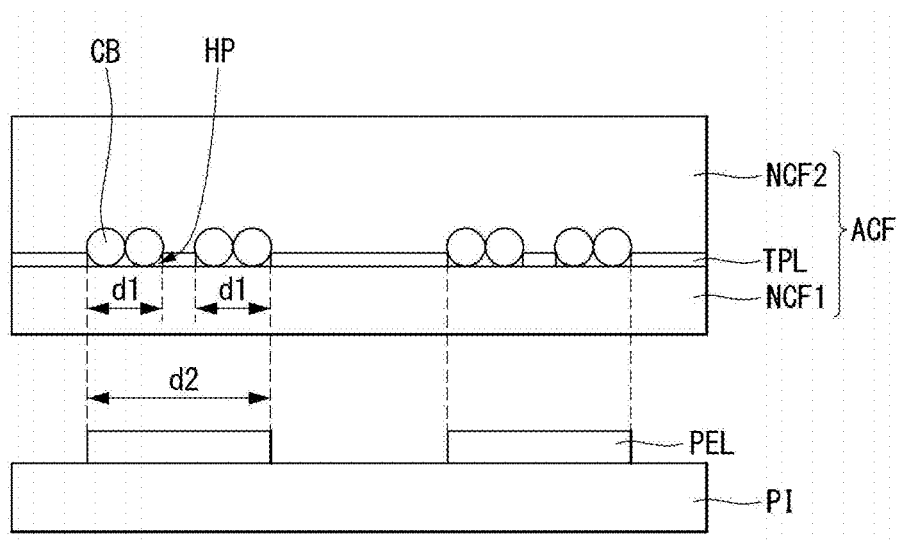

FIG. 8 is a cross-sectional view of an anisotropic conductive film according to an example embodiment. FIG. 9 is a perspective view of an anisotropic conductive film according to an example embodiment. FIG. 10 is a cross-sectional view of a conductive ball. FIGS. 11 and 12 are cross-sectional views illustrating a substrate and an anisotropic conductive film according to an example embodiment.

As shown in FIGS. 8 and 9, the anisotropic conductive film ACF according to an example embodiment includes two non-conductive layers NCF1 and NCF2, and a pattern layer TPL and conductive balls CB between the two non-conductive layers NCF1 and NCF2.

More specifically, the anisotropic conductive film ACF includes the first non-conductive layer NCF1 and the second non-conductive layer NCF2. The first non-conductive layer NCF1 is disposed at a lower part of the anisotropic conductive film ACF, and the second non-conductive layer NCF2 is disposed at an upper part of the anisotropic conductive film ACF. The first non-conductive layer NCF1 and the second non-conductive layer NCF2 are adhesives with non-conductivity or insulation and include at least one of a thermosetting resin and a thermoplastic resin. Examples of the thermosetting resin may include a bisphenol-A epoxy resin, a bisphenol-F epoxy resin, a novolac epoxy resin, a phenol resin, a urea resin, a melamine resin, an unsaturated polyester resin, a resorcinol resin, and the like. However, embodiments are not limited thereto. Examples of the thermoplastic resin may include a saturated polyester resin, a vinyl resin, an acrylic resin, a polyolefin resin, a polyvinyl acetate (PVA) resin, a polycarbonate resin, a cellulose resin, a ketone resin, a styrene resin, and the like. However, embodiments are not limited thereto.

The pattern layer TPL is disposed between the first non-conductive layer NCF1 and the second non-conductive layer NCF2. The pattern layer TPL has a patterned structure and includes a plurality of holes HP. The pattern layer TPL may be formed of the same material as the first and second non-conductive layers NCF1 and NCF2. For example, the pattern layer TPL is an adhesive with non-conductivity or insulation and includes at least one of a thermosetting resin and a thermoplastic resin. Examples of the thermosetting resin may include a bisphenol-A epoxy resin, a bisphenol-F epoxy resin, a novolac epoxy resin, a phenol resin, a urea resin, a melamine resin, an unsaturated polyester resin, a resorcinol resin, or the like. However, embodiments are not limited thereto. Examples of the thermoplastic resin may include a saturated polyester resin, a vinyl resin, an acrylic resin, a polyolefin resin, a polyvinyl acetate (PVA) resin, a polycarbonate resin, a cellulose resin, a ketone resin, a styrene resin, or the like. However, embodiments are not limited thereto.

The pattern layer TPL includes the plurality of holes HP. The hole HP is a space in which the conductive balls CB are trapped, and penetrates the pattern layer TPL to expose the first non-conductive layer NCF1 underlying the pattern layer TPL. The plurality of holes HP functions to trap the conductive balls CB and fix a position of the conductive balls CB. Thus, the conductive balls CB may be disposed concentrically in the plurality of holes HP.

As shown in FIG. 10, the conductive ball CB disposed in the hole HP is a particle having a size of several hundreds of nanometers and including an insulated surface. For example, the conductive ball CB includes a first insulating layer PO1, a first conductive layer ML1 surrounding the first insulating layer PO1, a second conductive layer ML2 surrounding the first conductive layer ML1, and a second insulating layer PO2 surrounding the second conductive layer ML2. When the anisotropic conductive film ACF is pressurized and contacts the pad electrode PEL, the second insulating layer PO2 at the surface of the conductive ball CB bursts. Hence, the second conductive layer ML2 underlying the second insulating layer PO2 is exposed, and the conductive ball CB can provide conductivity. As a result, the conductive ball CB can have both insulating properties and conductive properties at the same time.

The first conductive layer ML1 and the second conductive layer ML2 of the conductive ball CB may be conductive particles formed of nickel, gold, platinum, copper, or the like. The first insulating layer PO1 and the second insulating layer PO2 of the conductive ball CB may be formed of styrene-based polymer, acrylic-based polymer, or the like. A diameter of the conductive ball CB may be 1 µm to 10 µm, preferably and in some configurations may be 2 µm to 5 µm.

An amount of the conductive balls CB may be about 1 to 30 parts by weight based on 100 parts by weight of the total of the anisotropic conductive film ACF.

As shown in FIG. 11, the plurality of holes HP may be disposed respectively corresponding to the pad electrodes PEL disposed on the flexible substrate PI. Namely, one hole HP may overlap one pad electrode PEL, and thus, the holes HP may correspond one-to-one with the pad electrodes PEL. A width d1 of the hole HP may be equal to a width d2 of the pad electrode PEL on the flexible substrate PI. The width d1 of the hole HP may be less than a pitch P of the pad electrodes PEL. Hence, even if the anisotropic conductive film ACF is misaligned, the conductive ball CB of each hole HP can be prevented from contacting another pad electrode PEL adjacent to the corresponding pad electrode PEL. The anisotropic conductive film ACF according to the embodiment is configured such that the conductive balls CB are disposed in each hole HP, and the holes HP correspond one-to-one with the pad electrodes PEL. Hence, the embodiment can smoothly contact the conductive balls CB and the pad electrodes PEL, prevent the gathering of the conductive balls CB, and prevent a short-circuit of the pad electrodes PEL.

As shown in FIG. 12, at least two holes HP may be disposed to overlap one pad electrode PEL. Namely, a sum (d1+d1) of widths d1 of the holes HP may be less than a width d2 of one pad electrode PEL. Even if the anisotropic conductive film ACF thus formed is misaligned, the conductive ball CB in one of the two or more holes HP can contact the pad electrode PEL. Therefore, the embodiment can improve the contact reliability.

Figure 13:
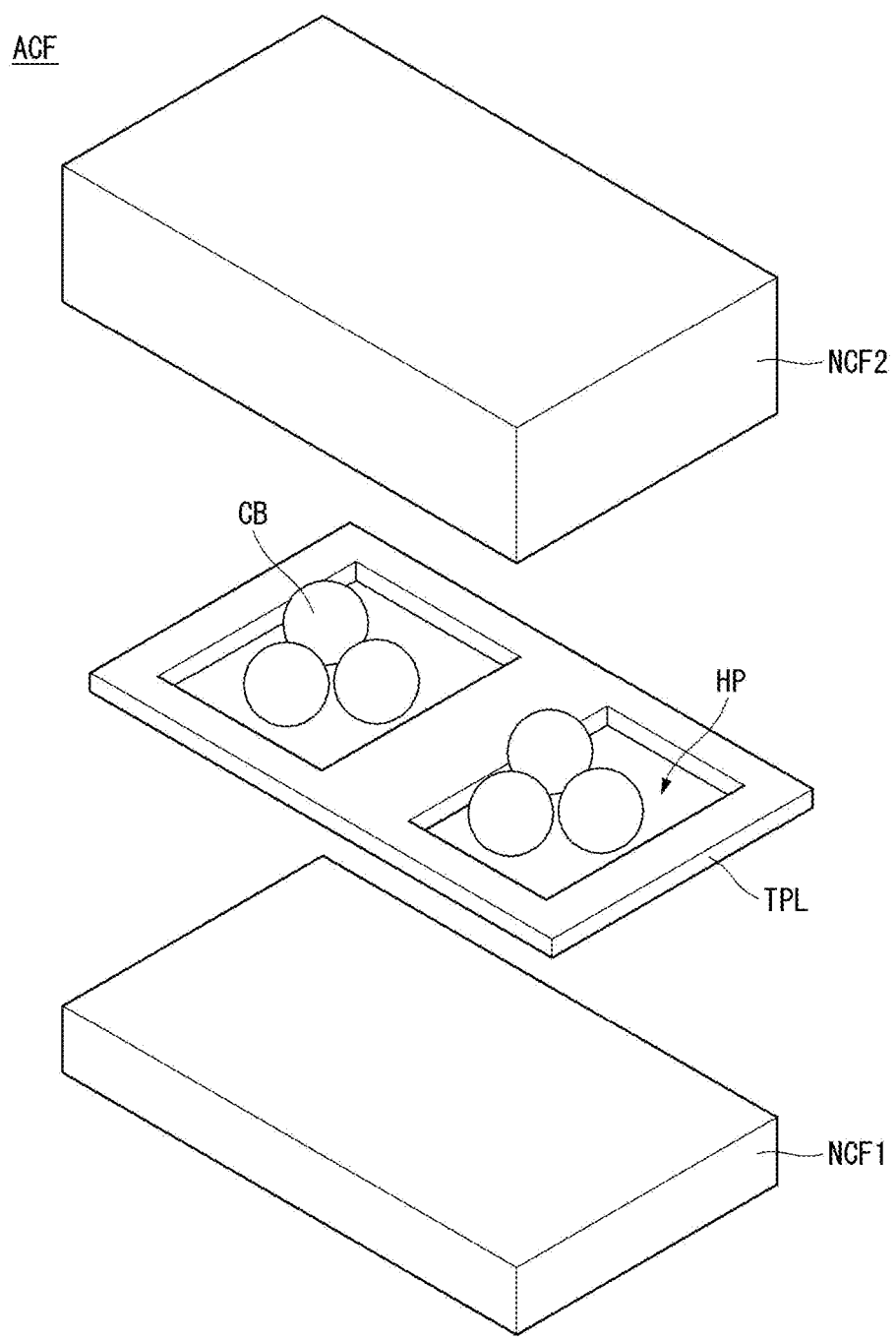
FIG. 13 is a perspective view of an anisotropic conductive film according to an example embodiment.
Figure 14:
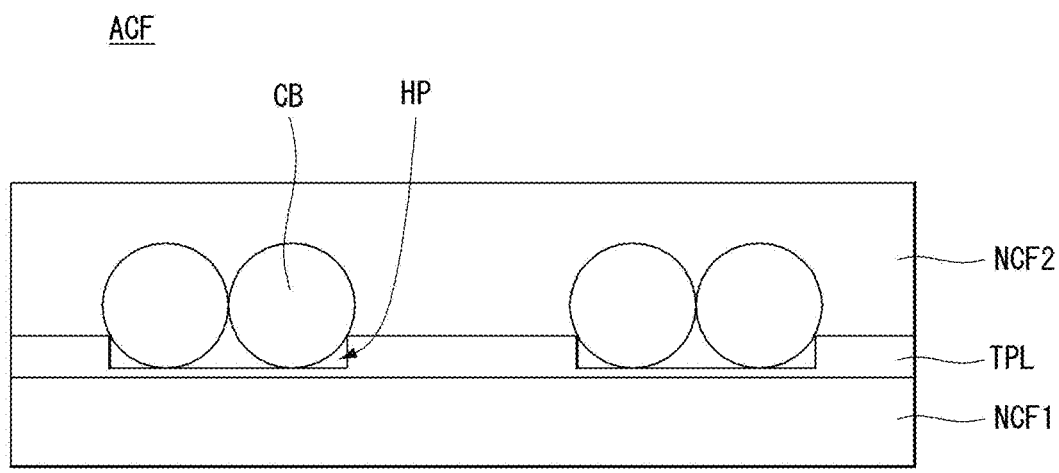
FIGS. 14 and 15 are cross-sectional views of an anisotropic conductive film according to an example embodiment.
Figure 15:
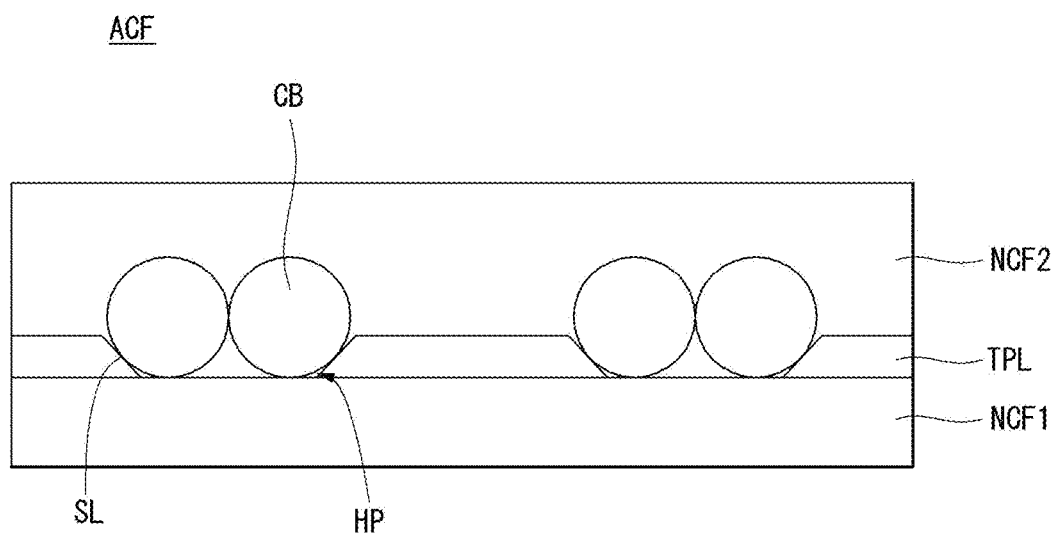

The hole HP of the anisotropic conductive film ACF according to the embodiment may have various structures. FIG. 13 is a perspective view of an anisotropic conductive film according to an example embodiment. FIGS. 14 and 15 are cross-sectional views of an anisotropic conductive film according to an example embodiment.

As shown in to FIG. 13, the anisotropic conductive film ACF according to the example embodiment may include a plurality of holes HP. Each hole HP penetrates the pattern layer TPL and is surrounded by the pattern layer TPL in all directions. For example, the hole HP may have a well shape. Thus, the embodiment can prevent the conductive balls CB trapped in each hole HP from getting out of the hole HP.

With reference to FIG. 14, each of a plurality of holes HP according to the example embodiment may be formed in a shape of a groove formed on the pattern layer TPL. As described above, the hole HP shown in FIG. 8 is configured to penetrate the pattern layer TPL and expose the first non-conductive layer NCF1 underlying the pattern layer TPL. However, embodiments are not limited thereto. For example, the hole HP may be formed in a shape of a groove in which a portion of the pattern layer TPL is recessed.

As shown in FIG. 15, each of a plurality of holes HP of the anisotropic conductive film ACF according to the embodiment may have an inclined surface SL. The inclined surface SL may has an inclination angle with respect to the surface of the first non-conductive layer NCF1 underlying the pattern layer TPL. For example, the inclination angle may be 30° to 90°. The inclined surface SL of the hole HP can facilitate the movement of the conductive balls CB to the hole HP when the conductive balls CB are applied.

Figure 16:
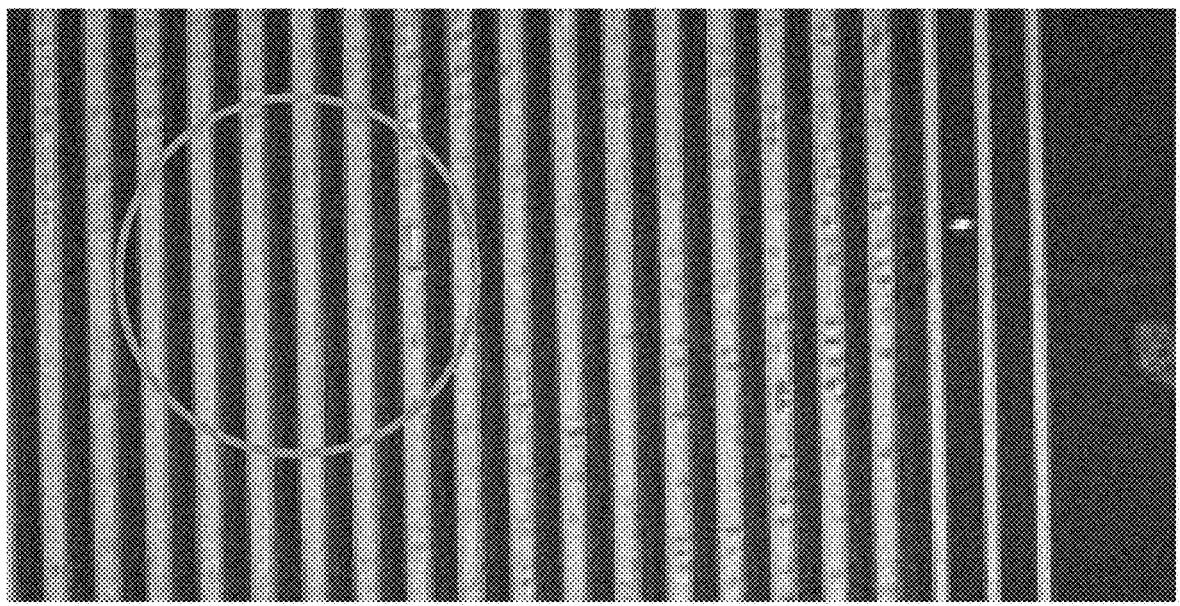
FIG. 16 is an image of a pad portion attached to a chip-on film using a related art anisotropic conductive film.
Figure 17:
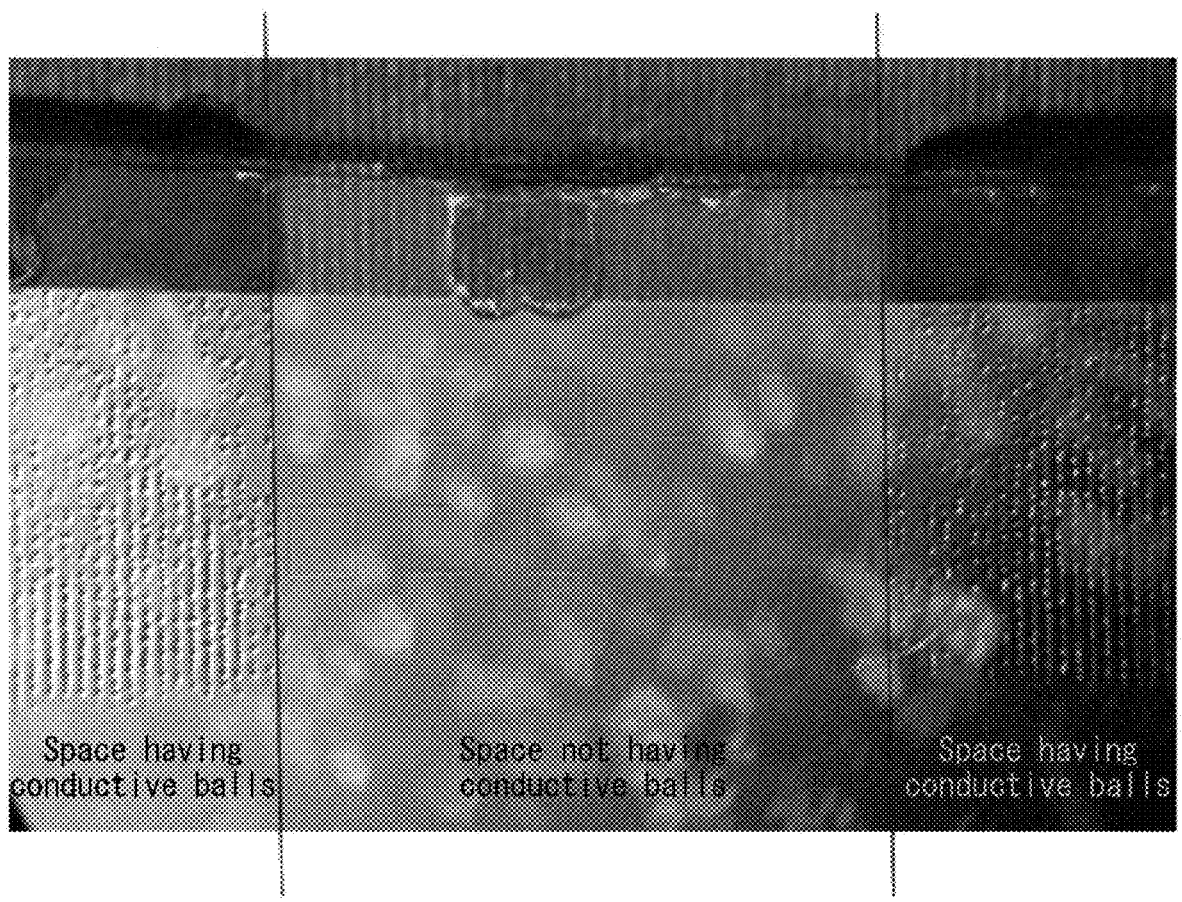
FIG. 17 is an image of a pad portion attached to a chip-on film using an anisotropic conductive film according to an example embodiment.

FIG. 16 is an image of a pad portion attached to a chip-on film using a related art anisotropic conductive film. FIG. 17 is an image of a pad portion attached to a chip-on film using an anisotropic conductive film according to an example embodiment.

After a related art anisotropic conductive film in which conductive balls were randomly disposed on a non-conductive layer was attached to a pad portion of a substrate, the pad portion was observed. It could be seen from FIG. 16 that a pressure mark generated when the conductive balls were pressurized on the electrodes did not appear on a large area.

After the anisotropic conductive film of FIG. 8 according to the embodiment was attached to the pad portion of the substrate, the pad portion was observed. As shown in FIG. 17, a pressure mark uniformly appeared in the plurality of holes in which the conductive balls were disposed, and did not appear in an area in which there was no hole.

It can be seen from FIG. 17 that the anisotropic conductive film according to the example embodiment includes the conductive balls in the plurality of holes and attaches the conductive balls to areas corresponding to the pad electrodes of the substrate, thereby smoothly connecting the conductive balls to the pad electrodes.

As described above, the anisotropic conductive film according to the embodiment includes the pattern layer having the plurality of holes between the non-conductive layers and disposes the conductive balls in the plurality of holes, thereby smoothly contacting the conductive balls to the pad electrodes of the substrate.

Furthermore, the anisotropic conductive film according to the embodiment can prevent the gathering of the conductive balls and prevent the short circuit of the pad electrodes by disposing the conductive balls in the plurality of holes.

It will be apparent to those skilled in the art that various modifications and variations can be made in the anisotropic conductive film and the display device including the same of the present disclosure without departing from the technical idea or scope of the disclosure. Thus, it is intended that the present disclosure cover the modifications and variations of this disclosure provided they come within the scope of the appended claims and their equivalents.

What is claimed is:

1. An anisotropic conductive film, comprising:
    a plurality of electrodes;
    a first non-conductive layer directly contacting an upper surface of each electrode;
    a pattern layer directly contacting an upper surface of the first non-conductive layer, the pattern layer including a plurality of holes;
    a plurality of conductive balls in the plurality of holes of the pattern layer, the plurality of conductive balls being in direct contact with the first non-conductive layer; and
    a second non-conductive layer on the pattern layer and the plurality of conductive balls,
    wherein each conductive ball directly contacts a corresponding one of the electrodes through the first non-conductive layer,
    wherein widths of the plurality of holes are determined corresponding to widths of the electrodes,
    wherein two or more conductive balls are arranged in one hole, and
    wherein the first and second non-conductive layers and the pattern layer are disposed between two adjacent electrodes, and.

2. The anisotropic conductive film of claim 1, wherein each of the plurality of holes is a through hole penetrating the pattern layer.

3. The anisotropic conductive film of claim 2, wherein at least one side of each of the plurality of holes has an inclined surface relative to a surface of the pattern layer.

4. The anisotropic conductive film of claim 3, wherein the inclined surface has an inclination angle of 30° to 90° with respect to a surface of the first non-conductive layer.

5. The anisotropic conductive film of claim 1, wherein each of the first non-conductive layer, the second non-conductive layer, and the pattern layer includes a thermosetting resin having at least one of a bisphenol-A epoxy resin, a bisphenol-F epoxy resin, a novolac epoxy resin, a phenol resin, a urea resin, a melamine resin, an unsaturated polyester resin, and a resorcinol resin, or a thermoplastic resin having at least one of a saturated polyester resin, a vinyl resin, an acrylic resin, a polyolefin resin, a polyvinyl acetate (PVA) resin, a polycarbonate resin, a cellulose resin, a ketone resin, and a styrene resin.

6. A display device, comprising:
    a flexible substrate;
    a display unit on the flexible substrate, the display unit including organic light emitting diodes;
    a pad portion at an edge region of the flexible substrate, the pad portion including a plurality of pad electrodes;
    a chip-on film on the pad portion; and
    an anisotropic conductive film disposed between the pad portion and the chip-on film, the anisotropic conductive film being configured to attach the pad portion to the chip-on film, wherein the anisotropic conductive film includes including:
    a plurality of electrodes;
    a first non-conductive layer directly contacting an upper surface of each electrode;
    a pattern layer directly contacting an upper surface of the first non-conductive layer, the pattern layer including a plurality of holes;
    a plurality of conductive balls in the plurality of holes of the pattern layer; and
    a second non-conductive layer on the pattern layer and the plurality of conductive balls,
    wherein each conductive ball directly contacts a corresponding one of the plurality of pad electrodes through the first non-conductive layer,
    wherein a width of each of the plurality of holes is determined corresponding to a width of each of the plurality of pad electrodes, respectively,
    wherein two or more conductive balls are arranged in one hole,
    wherein the first and second non-conductive layers and the pattern layer are disposed between two adjacent electrodes.

7. The display device of claim 6, wherein at least one of the widths of the plurality of holes is equal to or less than at least one of the widths of the plurality of pad electrodes.

8. The display device of claim 6, wherein at least one of the widths of the plurality of holes is less than a pitch of the plurality of pad electrodes.

9. The display device of claim 6, wherein at least one of the plurality of holes having at least one of the conductive balls in direct contact with the first non-conductive layer overlaps a respective one of the plurality of pad electrodes of the pad portion with respect to a plan view.

10. The display device of claim 6, wherein at least one the conductive balls directly contacts the pad electrode and the chip-on film.

11. The display device of claim 6, wherein each of the plurality of holes is a through hole penetrating the pattern layer.

12. The display device of claim 6, wherein at least one side of each of the plurality of holes has an inclined surface relative to a surface of the pattern layer.

13. The display device of claim 12, wherein the inclined surface has an inclination angle of 30° to 90° with respect to a surface of the first non-conductive layer.

14. The display device of claim 6, wherein each of the first non-conductive layer, the second non-conductive layer, and the pattern layer includes a thermosetting resin having at least one of a bisphenol-A epoxy resin, a bisphenol-F epoxy resin, a novolac epoxy resin, a phenol resin, a urea resin, a melamine resin, an unsaturated polyester resin, and a resorcinol resin, or a thermoplastic resin having at least one of a saturated polyester resin, a vinyl resin, an acrylic resin, a polyolefin resin, a polyvinyl acetate (PVA) resin, a polycarbonate resin, a cellulose resin, a ketone resin, and a styrene resin.

15. The anisotropic conductive film of claim 1, wherein the conductive balls each comprise an insulating layer surrounding a conductive layer such that the insulting insulating layer bursts to expose the conductive layer when a pressure is applied to the respective conductive ball.

16. The anisotropic conductive film of claim 15, wherein a diameter of each of the conductive balls is greater than a thickness of the pattern layer.

17. The anisotropic conductive film of claim 1, wherein a diameter of each of the conductive balls is greater than a thickness of the pattern layer.

18. The anisotropic conductive film of claim 1, wherein the conductive balls each comprise a first insulating layer, a first conductive layer surrounding the first insulating layer, a second conductive layer surrounding the first conductive layer, and a second insulating layer surrounding the second conductive layer such that the second insulting insulating layer bursts to expose the conductive layer when a pressure is applied to the respective conductive ball.

19. The display device of claim 6, wherein the conductive balls each comprise an insulating layer surrounding a conductive layer such that the insulting insulating layer bursts to expose the conductive layer when a pressure is applied to the respective conductive ball.

20. The display device of claim 19, wherein a diameter of each of the conductive balls is greater than a thickness of the pattern layer.

* * * * *